US012787762B2

(12) United States Patent
Duan et al.

(10) Patent No.: US 12,787,762 B2

(45) Date of Patent: Nov. 3, 2026

(54) PACKAGE ARCHITECTURES WITH HETEROGENEOUS INTEGRATION OF VARIOUS DEVICE THICKNESSES

(71) Applicant: Intel Corporation, Santa Clara, CA (US)

(72) Inventors: Gang Duan, Chandler, AZ (US); Srinivas Pietambaram, Chandler, AZ (US); Brandon Marin, Gilbert, AZ (US); Suddhasattwa Nad, Chandler, AZ (US); Jeremy Ecton, Gilbert, AZ (US); Yang Wu, Chandler, AZ (US); Minglu Liu, Chandler, AZ (US); Yosuke Kanaoka, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 69 days.

(21) Appl. No.: 18/090,883

(22) Filed: Dec. 29, 2022

(65) Prior Publication Data

US 2024/0222219 A1 Jul. 4, 2024

(51) Int. Cl.

| | |
|---|---|
| ***H10W 40/22*** | (2026.01) |
| ***H10W 20/20*** | (2026.01) |
| ***H10W 40/70*** | (2026.01) |
| ***H10W 70/65*** | (2026.01) |
| ***H10W 74/01*** | (2026.01) |
| ***H10W 74/10*** | (2026.01) |
| ***H10W 90/00*** | (2026.01) |
| *H10W 72/00* | (2026.01) |
| *H10W 72/30* | (2026.01) |
| *H10W 74/15* | (2026.01) |

(52) U.S. Cl.

CPC ........... *H10W 40/22* (2026.01); *H10W 20/20* (2026.01); *H10W 40/70* (2026.01); *H10W 70/65* (2026.01); *H10W 74/019* (2026.01); *H10W 74/111* (2026.01); *H10W 90/00* (2026.01); *H10W 72/07354* (2026.01); *H10W 72/347* (2026.01); *H10W 72/877* (2026.01); *H10W 74/15* (2026.01); *H10W 90/724* (2026.01); *H10W 90/734* (2026.01)

(58) Field of Classification Search

CPC ........... H10W 20/20; H10W 72/07354; H10W 72/347; H10W 72/877; H10W 74/15; H10W 90/724; H10W 90/734

See application file for complete search history.

(56) References Cited

U.S. PATENT DOCUMENTS

| | | | | |
|---|---|---|---|---|
| 2019/0214328 | A1* | 7/2019 | Eid | H10W 40/778 |
| 2019/0287904 | A1* | 9/2019 | Seidemann | H10W 20/435 |
| 2020/0203254 | A1* | 6/2020 | Dhane | H10W 40/70 |
| 2020/0258847 | A1* | 8/2020 | Pietambaram | H10W 42/121 |
| 2020/0365421 | A1* | 11/2020 | Liu | H10P 72/74 |
| 2022/0068818 | A1* | 3/2022 | Song | H10W 70/611 |

* cited by examiner

*Primary Examiner* — Fernando L Toledo

*Assistant Examiner* — Adam S Bowen

(74) *Attorney, Agent, or Firm* — Essential Patents Group, LLP

(57) ABSTRACT

Microelectronic integrated circuit package structures include a first die and a second die both coupled to a bridge structure at an interface. A first thermally conductive mold material is on a first side of the interface and surrounds the first die and the second die. A second mold material is on a second, opposing side of the interface and surrounds the bridge structure.

19 Claims, 12 Drawing Sheets

PACKAGE ARCHITECTURES WITH HETEROGENEOUS INTEGRATION OF VARIOUS DEVICE THICKNESSES

BACKGROUND

In electronics manufacturing, integrated circuit (IC) packaging is a stage of manufacture where an IC that has been fabricated on a die or chip comprising a semiconducting material is coupled to a supporting case or "package" that can protect the IC from physical damage and support electrical interconnect suitable for further connecting to a host component, such as a printed circuit board (PCB). In the IC industry, the process of fabricating a package is often referred to as packaging, or assembly.

As demand for high performance computing (HPC) continues to rise, integration of heterogeneous devices within an IC package has become an important performance enabler. Heterogeneous integration scaling facilitates increased interconnect density and bandwidth, thus improving power efficiency. Many different advanced packaging architectures have been deployed to increase planar and 3D input/output (I/O) and wire per area density to achieve higher data bandwidth requirements, as well as improving more effective die disaggregation/heterogeneous integration. For example, 2.5D/3D advanced packaging technologies such as die embedding or silicon interposer architectures can significantly increase IC package I/O counts and density to meet the HPC product performance requirements.

However, high bandwidth memory (HBM) integration has been a challenge due to its heterogenous device thickness requirements. 2.5D/3D heterogeneous package architectures can present process challenges such as chip gap height control, thermal interface material thickness management and integrated heat spreader (IHS) process complexity.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
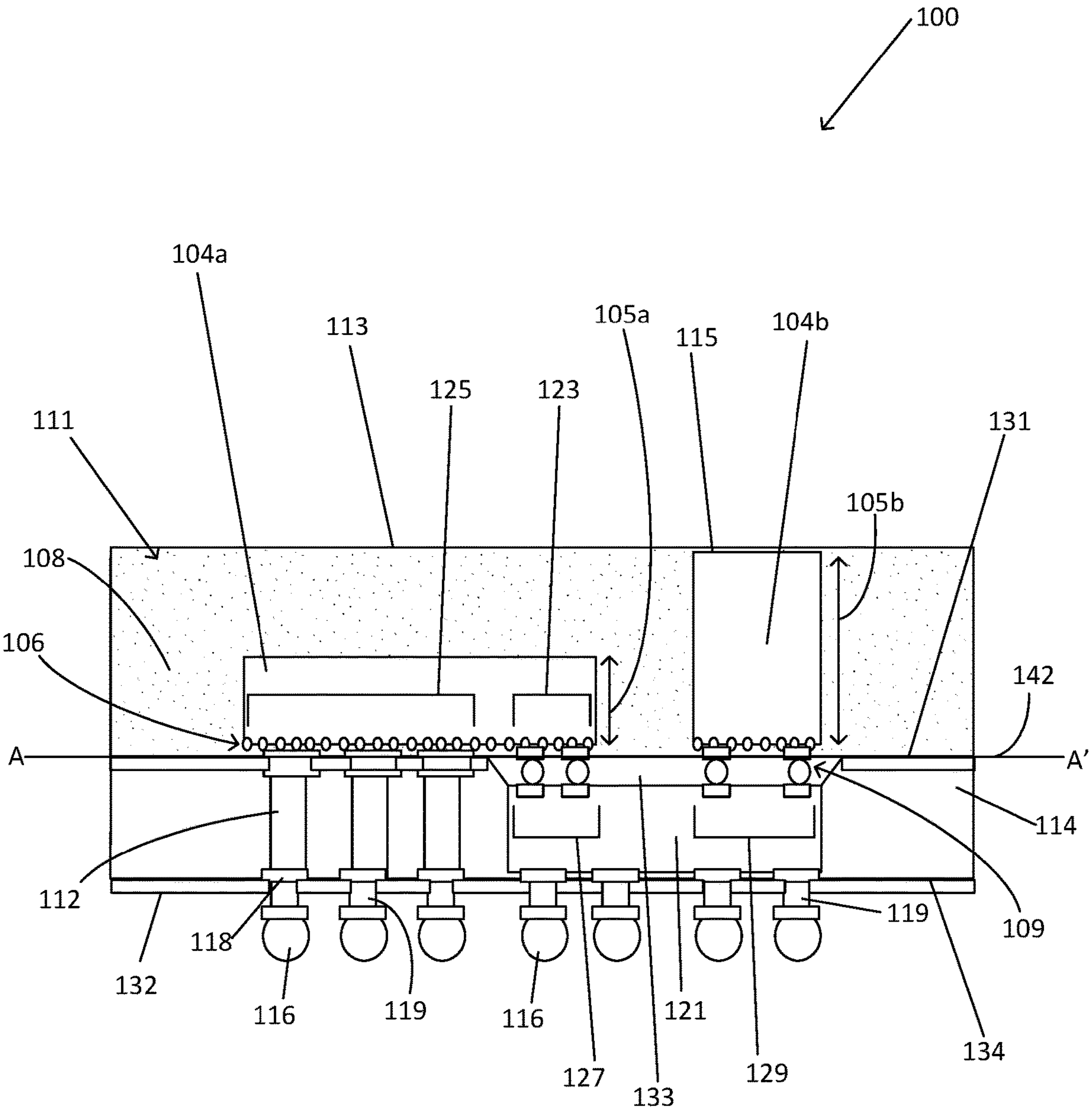
FIGS. 1A-1B are cross-sectional views of IC package structures comprising heterogeneous integration of various device thicknesses, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the explicit context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

The term "dielectric" generally refers to any number of non-electrically conductive materials that make up the structure of a package substrate.

The term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

The term "bond pad" generally refers to metallization structures that terminate integrated traces and vias in integrated circuit packages and dies. The term "solder pad" may be occasionally substituted for "bond pad" and carries the same meaning.

The term "solder bump" generally refers to a solder layer formed on a bond pad. The solder layer typically has a round shape, hence the term "solder bump".

The term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

Views labeled "cross-sectional", "profile" and "plan" correspond to orthogonal planes within a Cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments discussed herein address problems associated with packaging architectures employing heterogeneous integration, including those architectures having device thickness variations. For example, the use of glass carrier process embodiments described herein enables integration of heterogenous device thicknesses with a local bridge structure having die to die connections. The heterogeneous device integration assembly processes described herein enable advanced packaging architectures such as 2.5/3/D integration architectures enabling HPC with HBM applications, for example.

Challenges associated with heterogenous device thicknesses incorporation include device gap height control, such as thickness uniformity (top center bottom) of processed wafers during assembly, thermal interface material (TIM) thickness management, and IHS implementation complexity. For example, device gap height control can negatively impact TIM planarity and thus impacts IHS implementation, which significantly limits design flexibility and can result in yield loss and decreased throughput. The incorporation of thermally conductive mold materials within a package substrate, which act as a planar surface with which to place an IHS upon, eliminates device gap height control since a single TIM may be used across devices having different heights.

Embodiments herein describe architectures which provide a carrier technology to enable integration of devices having different thicknesses/heights. Local bridge die to die connections are enabled between heterogenous devices. The package structures herein can be utilized with or without through silicon vias (TSV), passive or active devices, or glass or silicon bridges. For example, package structures fabricated according to the heterogeneous device integration assembly processes of the embodiments herein may include an integrated circuit package where a first die and a second die are coupled to a bridge structure at an interface. The first die and second die may comprise a processor die or a memory component, for example, or any other suitable microelectronic components. In an embodiment, the first die and the second die have different heights from each other. For example, a top surface of the first die may be embedded within a first mold material, and a top surface of the second die may be substantially coplanar with the top surface of the first mold material.

In an embodiment, the first mold material is on a first side of the interface and surrounds the first die and at least partially the second die. The first mold material may comprise a thermally conductive filler material, such as aluminum, for example. A second mold material is on a second, opposing side of the interface and surrounds the bridge structure. In an embodiment, the bridge structure may comprise a silicon bridge structure.

In an embodiment, the second mold material may optionally comprise the thermally conductive filler material. A dielectric material may be between the first and second mold materials. The dielectric material includes any suitable dielectric material such as silicon nitride or silicon dioxide. A TIM may be on the first mold material, which is a substantially planar TIM, wherein the TIM is thermally coupled with the first and second dies. An IHS is on the TIM and is coupled to a substrate, wherein the substrate is coupled to the bridge structure and the first and second dies. By forming a single, planar TIM over the top surfaces of the heterogenous device heights, chip gap non-uniformity is avoided, and the reliability and performance of devices incorporating the embodiments included herein is greatly enhanced.

The architecture described herein may be assembled and/or fabricated with one or more of the features or attributes provided in accordance with various embodiments. A number of different assembly and/or fabrication methods may be practiced to generate microelectronic package structures having a planar TIM surface for IHS placement according to one or more of the features or attributes described herein.

Figure 1B:
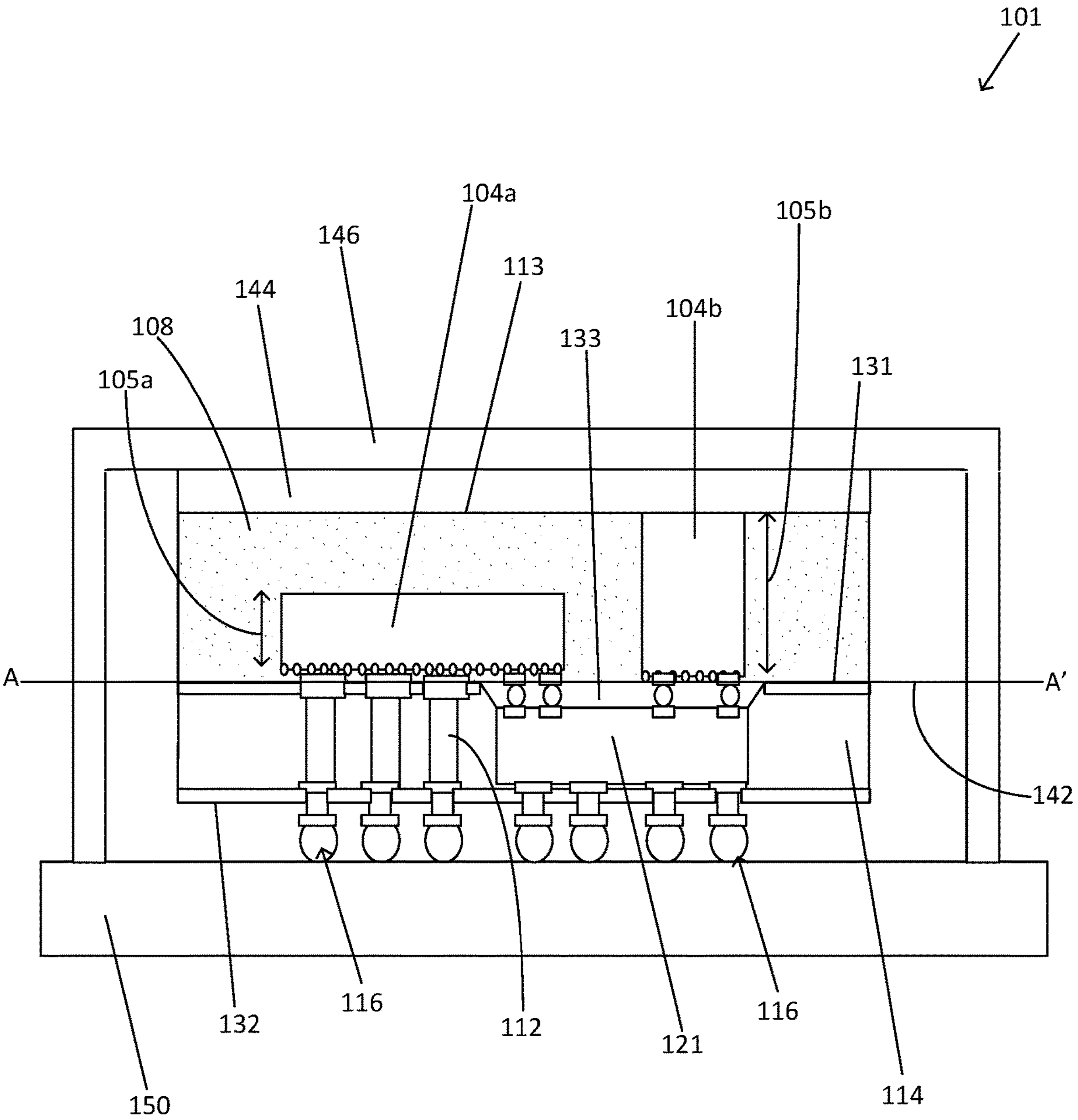

FIGS. 1A-1B illustrate embodiments of package structures to be utilized for substrates of packaged microelectronic devices, in accordance with some embodiments. The heterogeneous device integration architecture includes a first die and a second die both coupled to a bridge structure at an interface. A first mold material is on a first side of the interface and surrounds the first die and the second die. A second mold material is on a second, opposing side of the interface and surrounds the bridge structure. The package structure(s) are to be used as a portion of a microelectronic device. The heterogeneous device integration of the embodiments herein enable HPC with various device thicknesses, thus eliminating chip gap variation in packaged devices.

FIG. 1A is a cross-sectional view of a portion of an integrated circuit (IC) package structure 100, in accordance with some embodiments. In the embodiment depicted in FIG. 1A, IC package substrate structure 100 includes a first die 104*a* and a second die 104*b* that are adjacent to on another at an interface A-A', which is a longitudinal interface 142 through the package structure 100. First and second dies 104*a*, 104*b* may comprise any suitable die/device including, but not limited to, a microprocessor, a chipset, a graphics device, a wireless device, a memory device, an application specific integrated circuit, a transceiver device, an input/output device, stacks thereof, or the like.

In an embodiment, the first die 104*a* may be at least partially embedded within a first mold material 108 and may be over a second mold material 114. In an embodiment, the second die 104*b* may be completely surrounded by the first mold material 108 and the second die 104*b* may have a first side 115 that is at least partially coplanar with a top surface 113 of the first mold material 108. In an embodiment, the first and second dies 104*a*, 104*b* may be first known good dies, wherein they have been previously tested and have passed device specification requirements. In an embodiment, any number of dies may be on the interface 142. In embodiment, a height 105*a* of the first die 104*a* may be less than a height 105*b* of the of the second die 104*b*. In another embodiment, a first side 115 of the second die 104*b* may be completely embedded within the first mold material 108.

The first mold material 108 may comprise any suitable mold material, such as a polymer resin material, or any other suitable mold material as is known in the art. In an embodiment, the first mold material 108 may comprise a plurality of thermally conductive filler particles 111. In an embodiment, the thermally conductive filler material 111 may comprise a plurality of particles with a diameter size between about 20 nm and 100 microns. In an embodiment, the first mold material 108 may comprise a density of thermally conductive particles 111 of between about 3 and 97 percent volume. In an embodiment, the first mold material 108 comprises a thermal conductivity of between about 0.5 and 500 W/m-K. A first dielectric material 131 is between the first and second mold materials 108, 114. In an embodiment, the second mold material 114 may optionally comprise a thermally conductive plurality of filler particles 111. In an embodiment, the second mold material 114 may comprise similar materials as the first mold material 108 or may comprise different mold materials than the first mold material according to the particular application.

A bridge structure 121 may be coupled to the first and second die 104*a*, 104*b*, and may be located within the second mold material 114 on an opposite side of the interface 142 to the first and second die 104*a*, 104*b*. In an embodiment, the bridge structure 121 may comprise a silicon bridge structure 121 but may comprise any suitable material in other embodiments. A first portion 127 of a bridge structure 121 may be coupled to a first portion 123 of the first die 104*a* and a second portion 129 of the bridge structure 121 may be coupled to the second die 104*b*. In an embodiment, bridge structure 121 may comprise a structure such as an interposer or any suitable substrate with which to electrically couple the first and second dies 104*a*, 104*b* to each other.

The bridge structure 121 may be coupled to the first portion 123 of the first die 104*a* and to the second die 104*b* by solder interconnect structures 109. The solder interconnect structures 109 may comprise any suitable conductive materials such as copper materials and/or solder materials for example. In an embodiment, an underfill material 133 may surround the solder interconnect structures 109 and may be between the first portion 123 of the first die 104*a*, the second die 104*b* and the bridge structure 121. The underfill material 133 may comprise an epoxy material, in an embodiment. The underfill material 133 may comprise a reentrant profile due to the implementation of a carrier removal process (to be described subsequently herein), wherein edges of the underfill material 133 comprise a reentrant profile between the bridge structure 121 and the first and second dies 104*a*, 104*b*.

Conductive via structures 112 are coupled to a second portion 125 of the first die 104*a*. The conductive vias 112 may comprise copper in an embodiment and may extend completely through the second mold material 114. In an embodiment, a plurality of conductive interconnect structures 106, such as copper interconnect structures 106 may couple the second portion 125 of the first die 104*a* to the conductive vias 112. In an embodiment, the plurality of conductive interconnect structures 106 are on the same side of the interface region 142 as the first and second dies 104*a*, 104*b*. The plurality of conductive vias 106 additionally couple the first portion 123 of the first die 104*a* to the bridge structure 121.

The first dielectric material 131 is adjacent to and between individual conductive via structures 112. The first dielectric material 131 is adjacent to and between individual conductive via structures 112. In an embodiment, the first dielectric material 131 is directly on portions of the individual conductive via structures 112. In an embodiment, a second dielectric material 132 is on a surface 134 of the second mold material 114. In an embodiment, the first and second dielectric materials 131, 132 may comprise silicon dioxide or silicon nitride, for example, and may comprise a thickness of about 0.1 to 5 microns. In an embodiment, the first dielectric material 131 is adjacent to and on portions of the underfill material 133.

In an embodiment, the second dielectric material 132 is adjacent to via structures 119 and pad structures 118 that are coupled to the conductive via structures 112. Solder balls 116 may be on the conductive via structures 112 and on the bridge structure 121. The second dielectric material 132 is adjacent to the solder balls 116 on the bridge structure 121. In an embodiment, the solder balls 116 on the bridge structure 121 and on the conductive vias structures 112 are substantially coplanar with one another, wherein the second dielectric material 132 is between individual solder balls 116.

FIG. 1B is a cross-sectional view of an IC package structure 101, in accordance with some embodiments. IC Package structure 101 includes first die 104*a* adjacent to the second die 104*b* at a first side of an interface region 142, wherein the first and second die 104*a*, 104*b* are coupled to the bridge structure 121. The bridge structure 121 is located on a second side of the interface region 142, opposite the first side of the interface region. An underfill material 133 is between a portion of the first die 104*a* and the second die 104*b* and the bridge structure 121. First mold material 108 surrounds the first and second dies 104*a*, 104*b* and second mold material 114 surrounds the bridge structure 121. The first mold material 108 comprises a thermally conductive mold material 108 similar to the mold material 108 of FIG. 1A. A surface 113 of the first mold material 108 is substantially planar. The first mold material 108 is thermally coupled with the first and second dies 104*a*, 104*b*.

A thermal interface (TIM) material 144 is on the first mold material 108. The TIM 144 may comprise any suitable TIM material, such as Sn, In, Au, Ag, or respective alloys for example. An integrated heat structure (IHS) 146 is on the TIM 144. Any suitable integrated heat structure may be utilized according to design requirements. Because the first mold material 108 is thermally conductive and substantially planar, the TIM 144 is able to provide thermal coupling between the dies 104*a*, 104*b* and the IHS 146.

Thus, the embodiments herein enable heterogeneous die heights, such as the first die height 105*a* of the first die 104*a* and the second die height 105*b* of the second die 105*b* within the IC package structure 101. The IHS 146 is coupled with a substrate 150. The substrate 150 may comprise any suitable substrate, such as an interposer or a board, for example. The conductive vias 112 on the first die 104*a* are coupled to the substrate 150 by solder balls 116. The bridge structure 121 is likewise coupled to the substrate 150 by solder balls 116. The embodiments herein enable the first die 104*a* to be coupled to both the substrate 150 with conductive vias 112, which may comprise plated conductive copper vias 112 and to the bridge structure 121 with solder interconnect structures 109, which may comprise single pitch solder interconnect structures, in an embodiment.

Figure 2A:
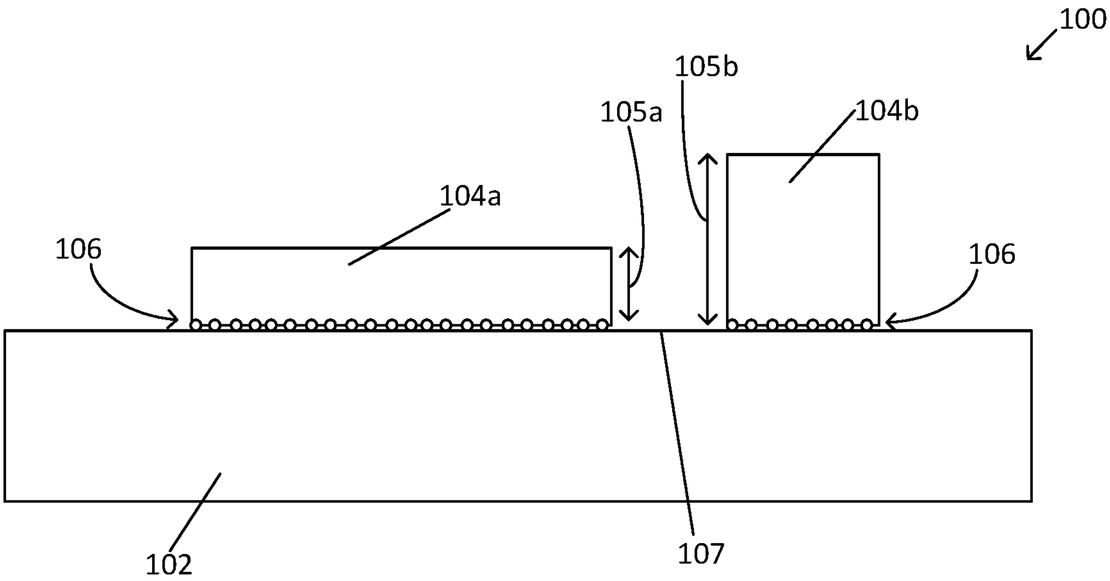
FIGS. 2A-2I illustrate cross-sectional views of structures formed during the fabrication of IC package structures comprising heterogeneous integration of various device thicknesses, in accordance with some embodiments.

FIGS. 2A-2I illustrate embodiments of forming an IC package structure (such as the IC package structures of FIGS. 1A-1B). FIG. 2A depicts a cross-sectional view of a portion of an IC package structure according to some embodiments. As shown, a first carrier 102 may be provided. First carrier 102 may comprise any suitable materials, and in an embodiment may comprise a glass or a silicon first carrier 102. In an embodiment, the first carrier 102 may comprise one or more dies 104*a*, 104*b* on a surface 107 of the first carrier 102, which may comprise silicon dies 104*a*, 104*b*. The dies 104*a*, 104*b* may comprise any suitable die/device in an embodiment. The dies 104*a*, 104*b* may comprise different heights 105*a*, 105*b* from each other in an embodiment. The one or more dies 104*a*, 104*b* may comprise a previously tested die 104*a*, 104*b* which has been deemed as a known good die.

In an embodiment, a plurality of conductive interconnect structures 106 may couple the one or more dies 104*a*, 104*b* with the first carrier 102. In an embodiment, the one or more dies 104*a*, 104*b* may comprise a first die 104*a* and a second die 104*b*, wherein the first and second dies 104*a*, 104*b* are adjacent to each other on the surface 107 of the first carrier 102. In an embodiment, the conductive interconnect structures 106 may comprise copper or alloys thereof. In other embodiments, the conductive interconnect structures 106 may comprise at least one of nickel, aluminum, lead tin or silver.

Figure 2B:
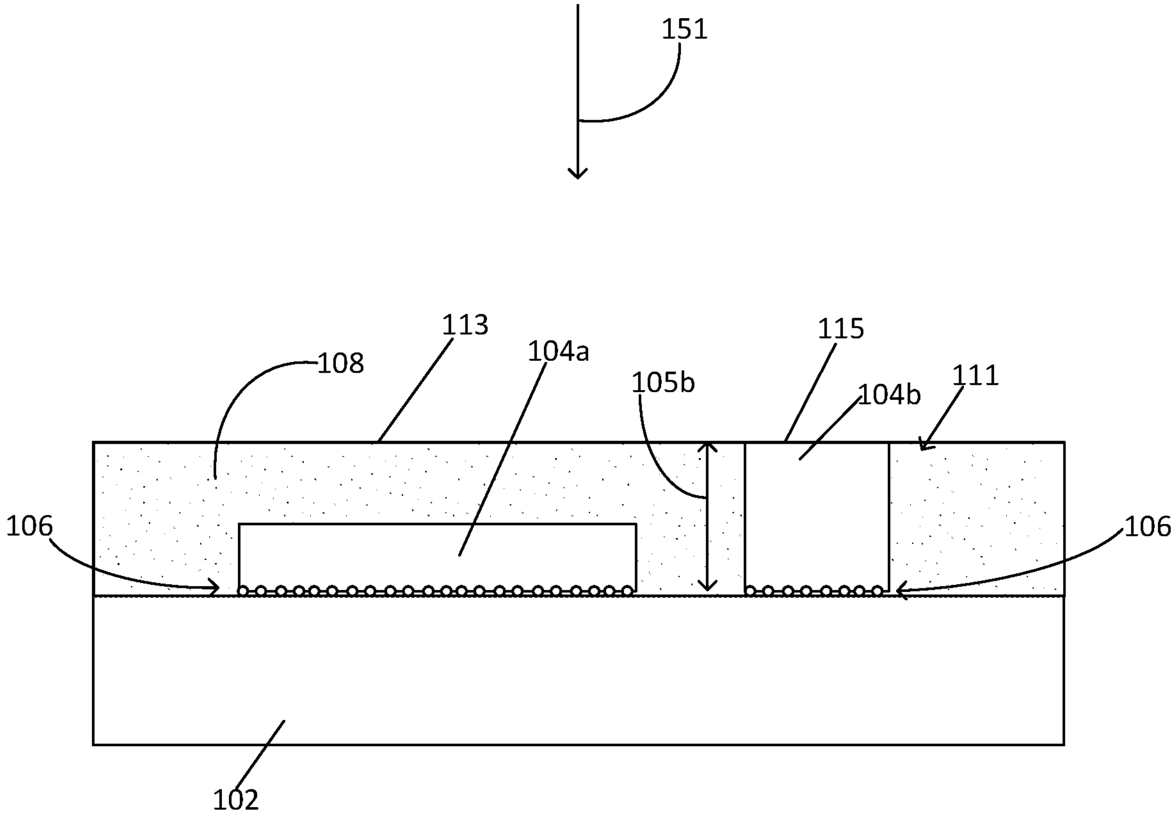

A formation process 151 may be employed to form a first mold material 108 on and over the dies 104*a*, 104*b* as well as on the surface 107 of the first carrier 102 (FIG. 2B). In an embodiment, the first mold material 108 may comprise an epoxy material, or any suitable mold material 108 with which to surround the one or more dies 104*a*, 104*b*. In an embodiment, the first mold material 108 may be formed to comprise a plurality of thermally conductive filler particles 111 embedded within an epoxy material. In an embodiment, the thermally conductive filler material 111 may comprise aluminum particles, or any other suitable thermally conductive filler material such as silver, copper, or alike. In an embodiment, the thermally conductive filler particles 111 may comprise a plurality of particles with a diameter size between about 20 nm and 100 microns. In an embodiment, the first mold material 108 may comprise a density of thermally conductive particles 111 of between about 3 and 97 percent volume. In an embodiment, the first mold material 108 comprises a thermal conductivity of between about 0.5 and 500 W/m-K.

The formation process 151 may comprise any suitable mold formation process 151 such as compression molding, transfer molding, hot press, or similar techniques. The first mold material 108 may comprise a thickness wherein a first side 113 of the first mold material 108 may be substantially coplanar with a first side 115 of the die with the greatest height (depicted as die 104*b*). In another embodiment, the first side 115 of the first die 104*a* may be underneath the first side 113 of the first mold material 108.

Figure 2C:
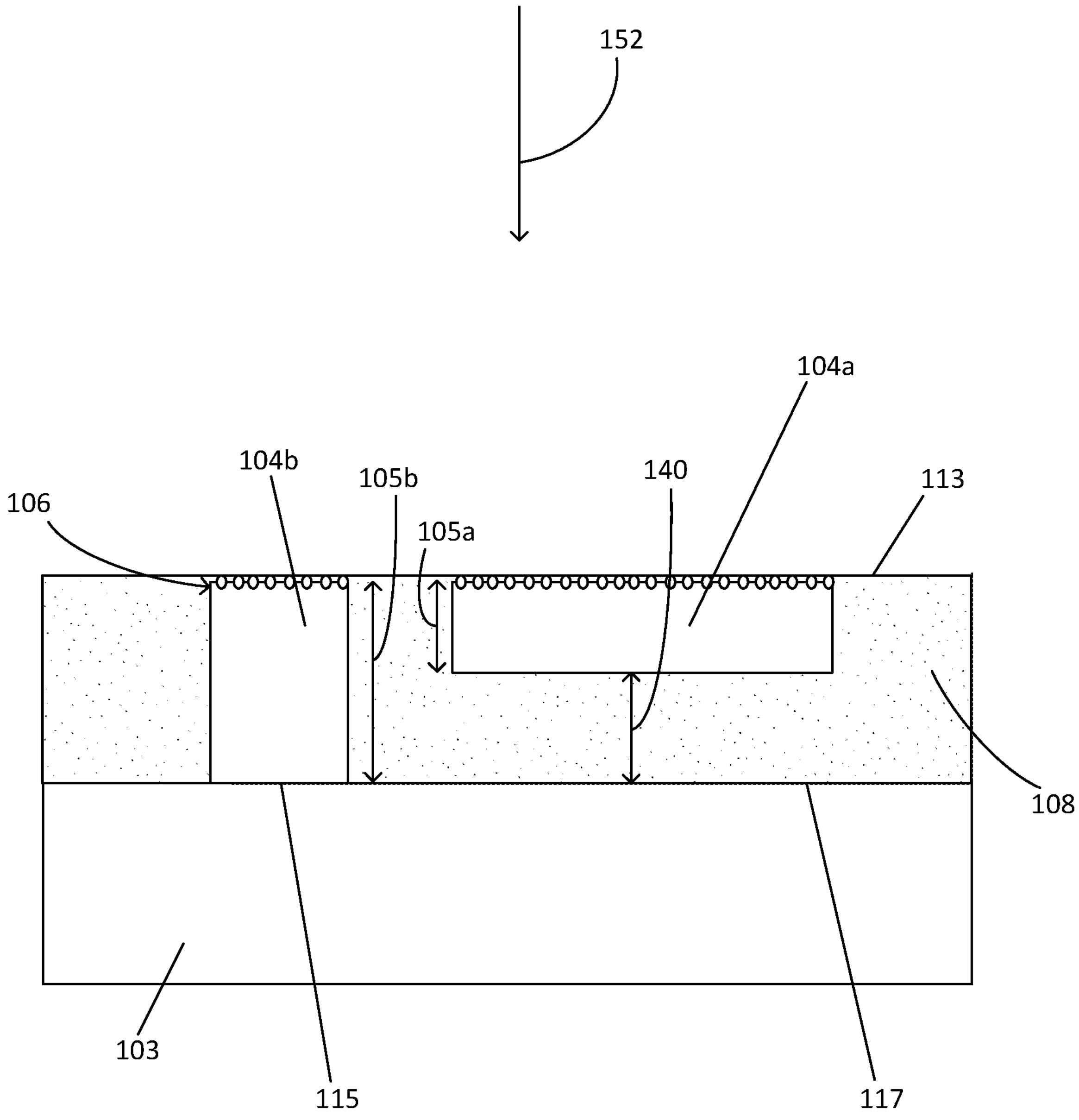

As shown in FIG. 2C, a replacement process 152 may be employed wherein the first carrier 102 may be removed from the first side 113 of the first mold material 108, and a second carrier 103 may be placed on a second side 117 of the first mold material 108. The second carrier 103 may comprise a glass material or a silicon material in an embodiment. In an embodiment, the second carrier 103 may be on the first side 115 of the second die 104*b* but is not on the first die 104*a* since the height 105*b* of the second die 104*b* is greater than the height 105*a* of the first die 104*a*. In an embodiment, a distance 140 is between the first side 115*a* of the first die 104*a* and the second side 117 of the first mold material 108. The conductive interconnect structures 106 are on or slightly below the first side 113 of the mold material 108, in an embodiment.

Figure 2D:
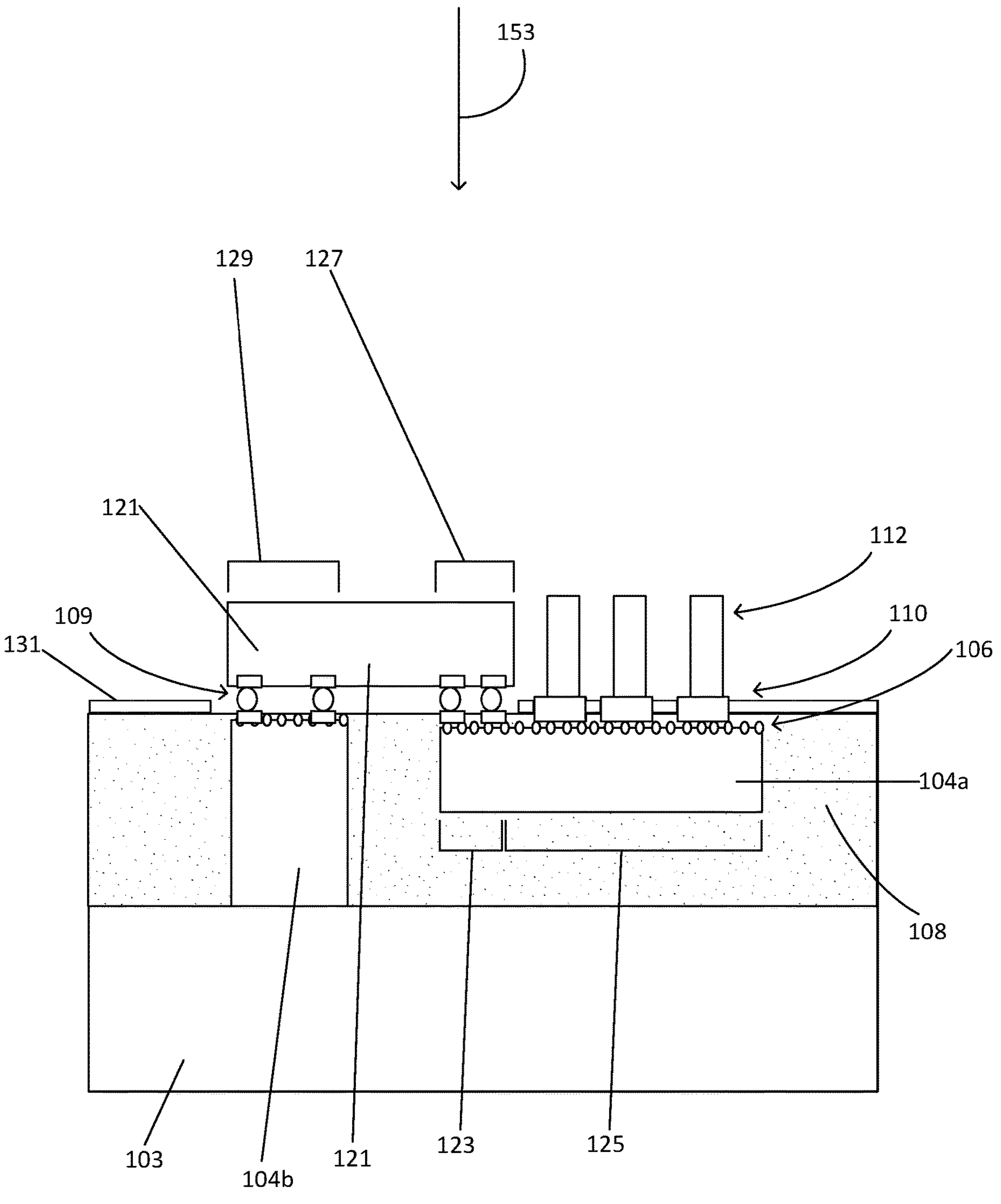

A first portion 127 of a bridge structure 121 may be placed on a first portion 123 of the first die 104*a* and may be placed on the second die 104*b* (FIG. 2D). The bridge structure 121 may comprise any suitable structure which conductively and physically couples the first die 104a to the second die 104b, such as a silicon bridge structure or an interposer for example. A coupling process 153 may be employed to place and couple the bridge structure 121 on both a portion of the first die 104a and on the second die 104b. During the coupling process, conductive joint structures 109 are utilized to couple the first portion 127 of the bridge structure 121 to the second die 104a and to couple the first portion 127 of the bridge structure 121 to the first portion 123 of the first die 104a.

Conductive via structures 112 may be formed on a second portion 125 of the first die 104a. Conductive via structures 112 may comprise copper via structures in an embodiment. In some embodiments the conductive via structures 112 may comprise any suitable conductive material. In an embodiment, the conductive via structures 112 may comprise plated copper via structures 112. In an embodiment, a first dielectric material 131, such as silicon dioxide or silicon nitride materials, for example, may be formed on the first mold material 108. In an embodiment, the first dielectric material 131 may be formed/patterned such that it is adjacent the bridge structure 121 and conductive via structures 109, and may be formed between individual conductive via structures 112.

Figure 2E:
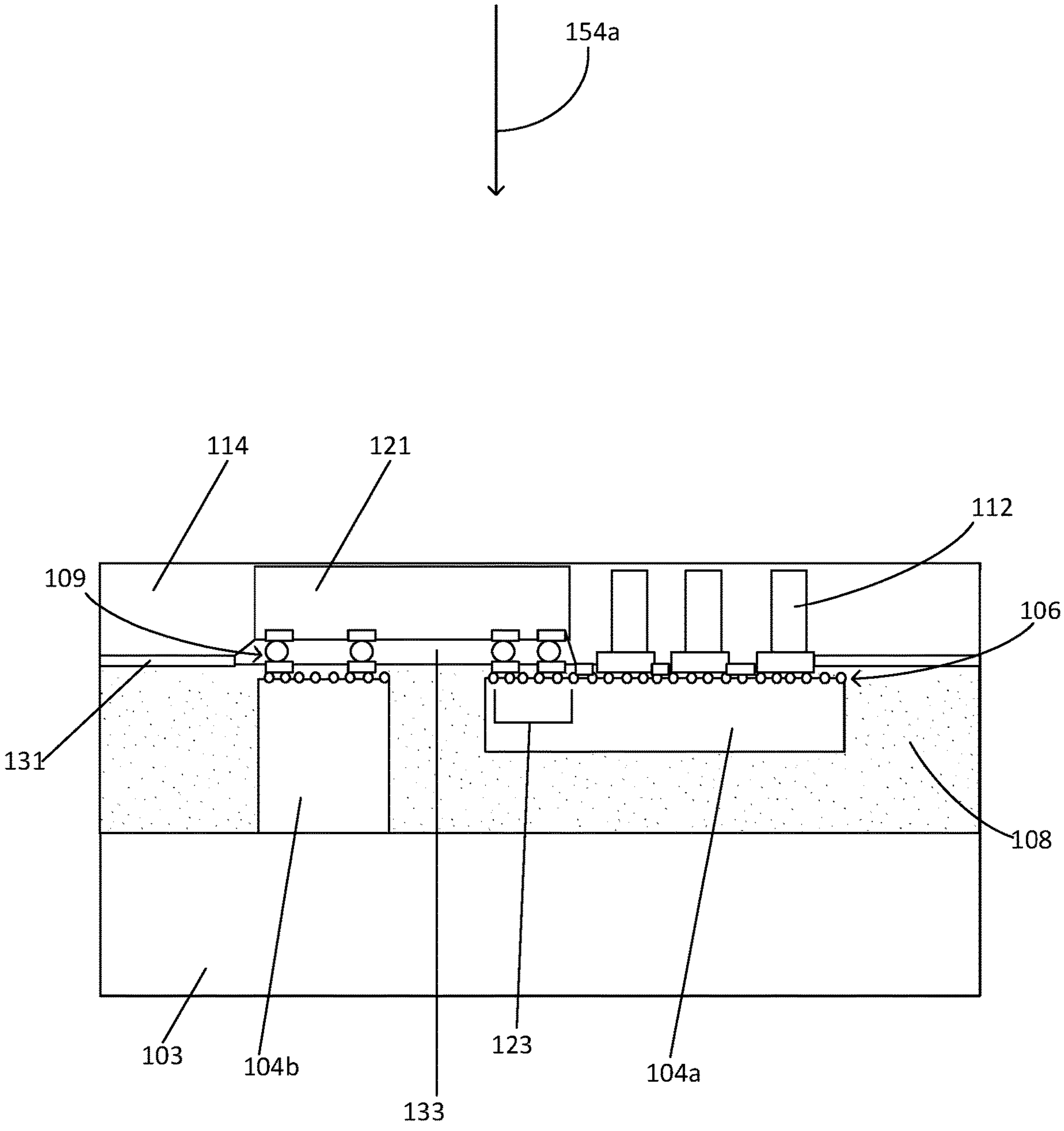
Figure 2F:
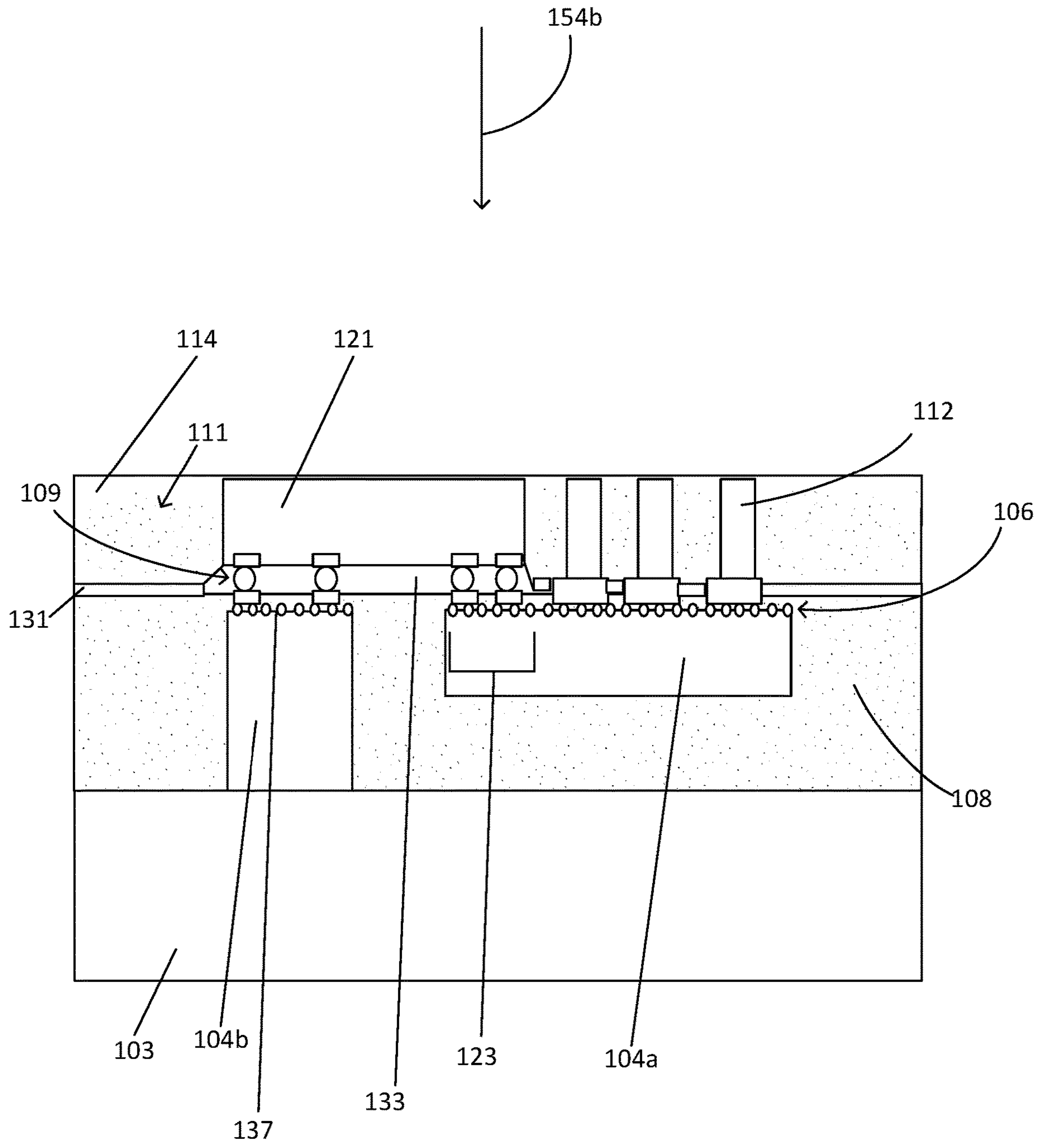

In FIG. 2E, a second mold material 114 may be formed over the first mold material 108 and may be formed at least partially to surround the bridge structure 121 by utilizing a formation process 154. The second mold material 114 may also be formed on the first dielectric material 131, on the underfill material 133 and on the conductive via structures 112 by utilizing the formation process 154a. In an embodiment, the second mold material 114 may be free of the thermally conductive material. In other embodiments, the second mold material 114' may comprise a thermally conductive filler 111 by utilizing the formation process 154b (FIG. 2F). The first dielectric material 131 is between the first mold material 108 and the second mold material 114.

An underfill material 133 may be formed between the bridge structure 121 and the second die 104b, and between the bridge structure 121 and the first portion 123 of the first die 104a. The underfill material 133 is on the solder joints 109 on the second die 104b and on the solder joints 109 on the first portion 123 of the first die 104a. In an embodiment, the underfill material 133 may comprise any suitable underfill material 133 such as a polymer material with suitable fillers. In an embodiment, the underfill material 133 comprises different materials than the first mold material 108 and the second mold material 114. First dielectric layer 131 may be adjacent to the underfill material 133.

Figure 2G:
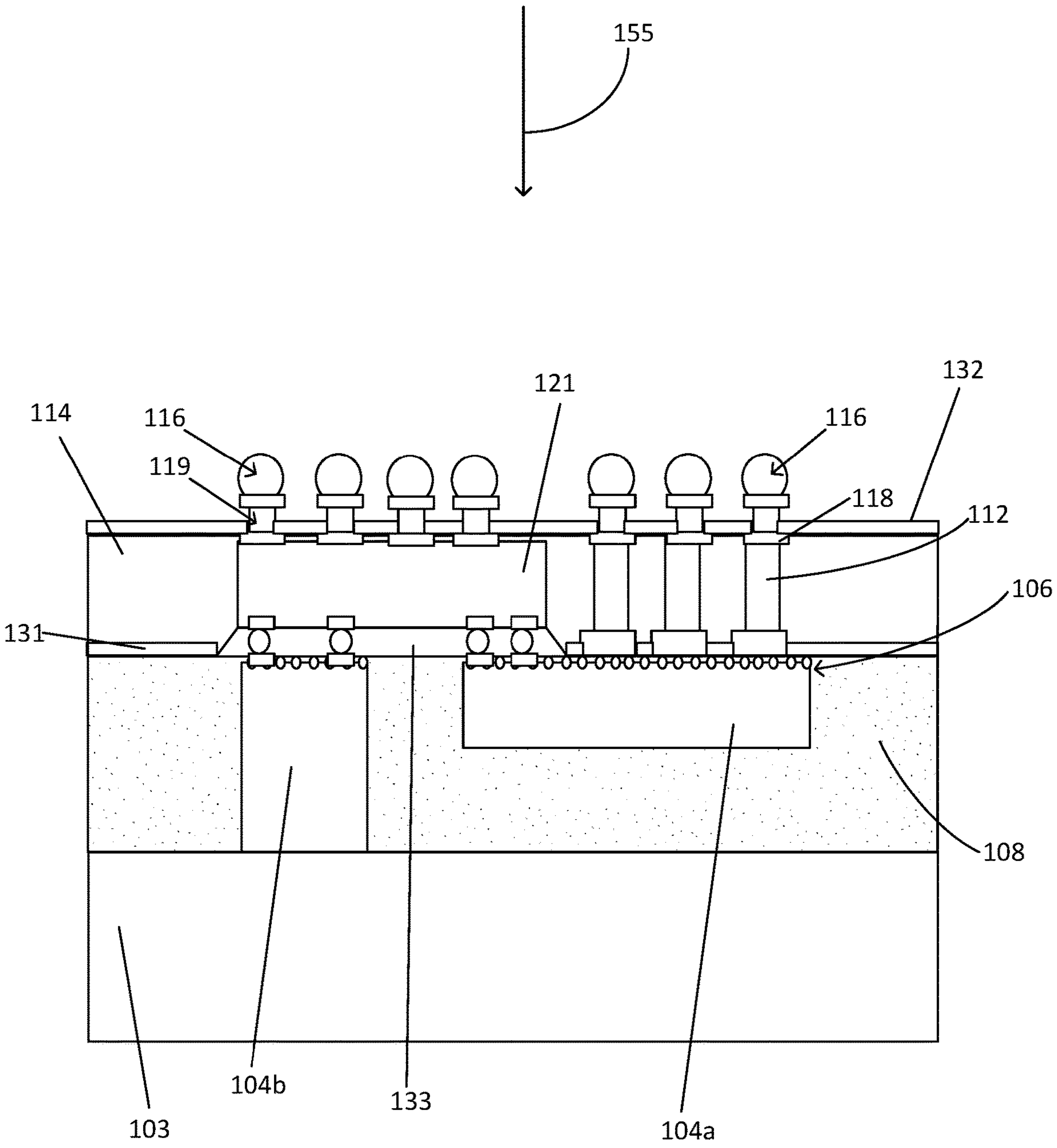

In an embodiment, pads 118 and vias 119 may be formed on the bridge structure 121 and on the conductive via structures 112 using a metallization process 155 (FIG. 2G). Solder balls 116 may be placed on the pads 118. The solder balls 116 may comprise any suitable solder material. A second dielectric layer 132 may be formed and patterned adjacent to the pads 118 and vias 119. In an embodiment, the second dielectric layer 132 may be formed on the second mold material 114 and over the first mold material 108 utilizing any suitable dielectric layer formation process. The second dielectric layer 132 may comprise a material such as silicon nitride or silicon oxide, in an embodiment. The second dielectric layer 132 may be formed utilizing such processes as physical deposition processes. In some embodiments, the second dielectric material 132 comprises any other suitable dielectric material. In an embodiment, the dielectric material 132 may comprise a thickness of between about 0.1 microns to about 5 microns.

Figure 2H:
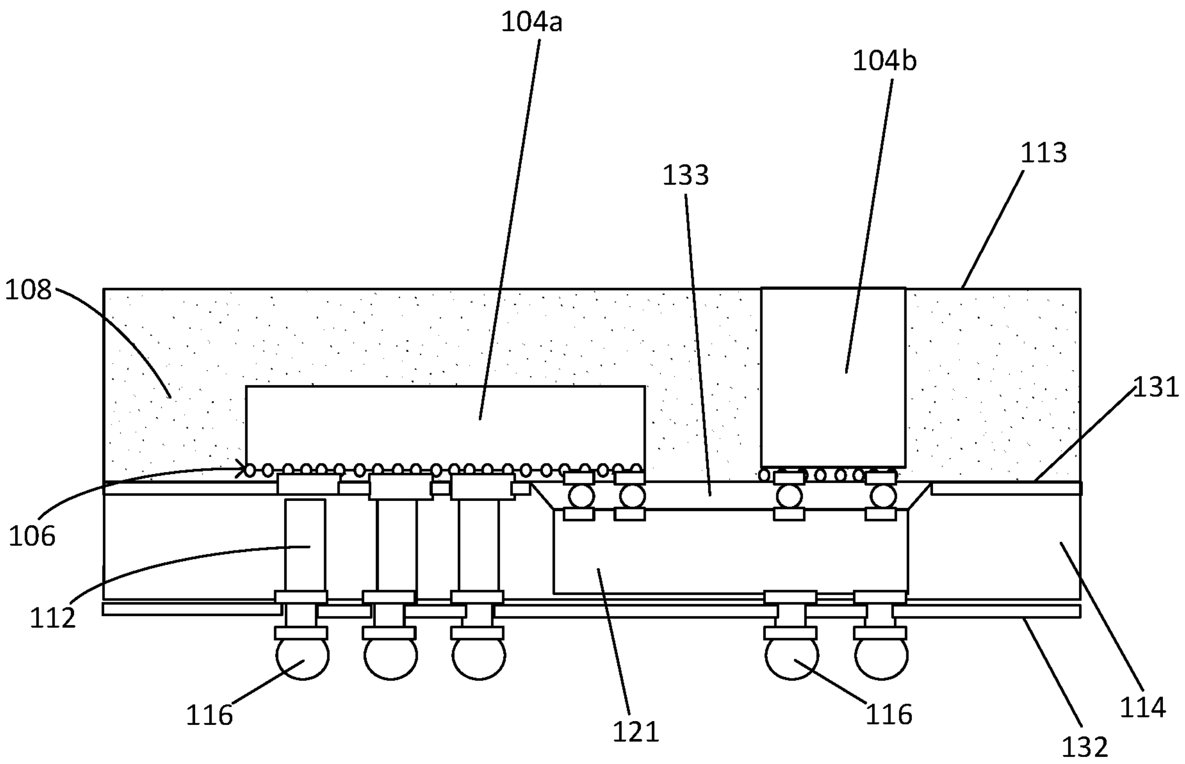
Figure 2I:
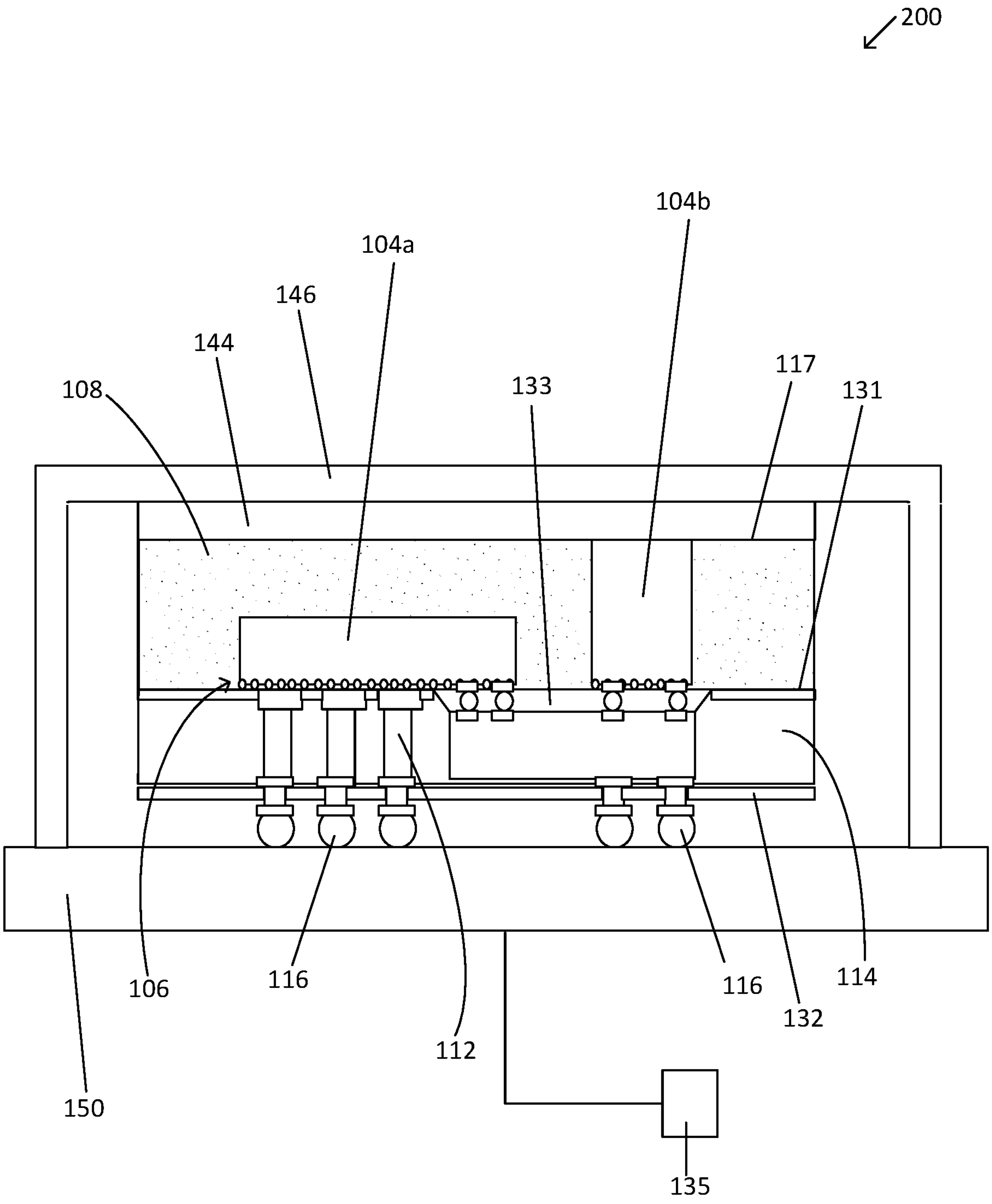

In FIG. 2H the second carrier 103 may be removed from the first mold material 108. In FIG. 2I a thermal interface material (TIM) 144 may be placed on the first side 113 of the first mold material 108. The TIM 144 may comprise such materials as Sn, In, Au, Ag, or their respective alloys and may comprise a thickness of between about 20 and 500 microns. An integrated heated spreader (IHS) 146 may be placed on a surface of the TIM 144. The IHS 146 may comprise any suitable thermally conductive material and is thermally coupled with the TIM 144. In an embodiment, the TIM 144 may comprise a planar layer over the first mold material 108. Because the first mold material 108 is thermally conductive, the TIM 144 does not need to be in physical contact with the first and second dies 104a, 104b. Thus, dies of different heights are accommodated within the package structure 200 which do not require a TIM on backsides of the die.

A substrate 150 may be coupled to the IHS 146. Dies 104a, 104b are electrically coupled to the substrate 150 through solder balls 116. As used herein, the solder balls interconnect structures indicate any structure or conductive element for coupling to an outside die or other device. In an embodiment, solder balls 116 may include one or more of silver, tin, or copper, or combinations or alloys thereof. Substrate 150 may be any suitable substrate such as an interposer or a board, for example. A power supply 135, which may comprise any suitable power supply as known in the art, may be coupled to dies '104a, 104b via IC package structure 200, in an embodiment.

Discussion now turns to operations for assembling and/or fabricating the discussed structures.

Figure 3:
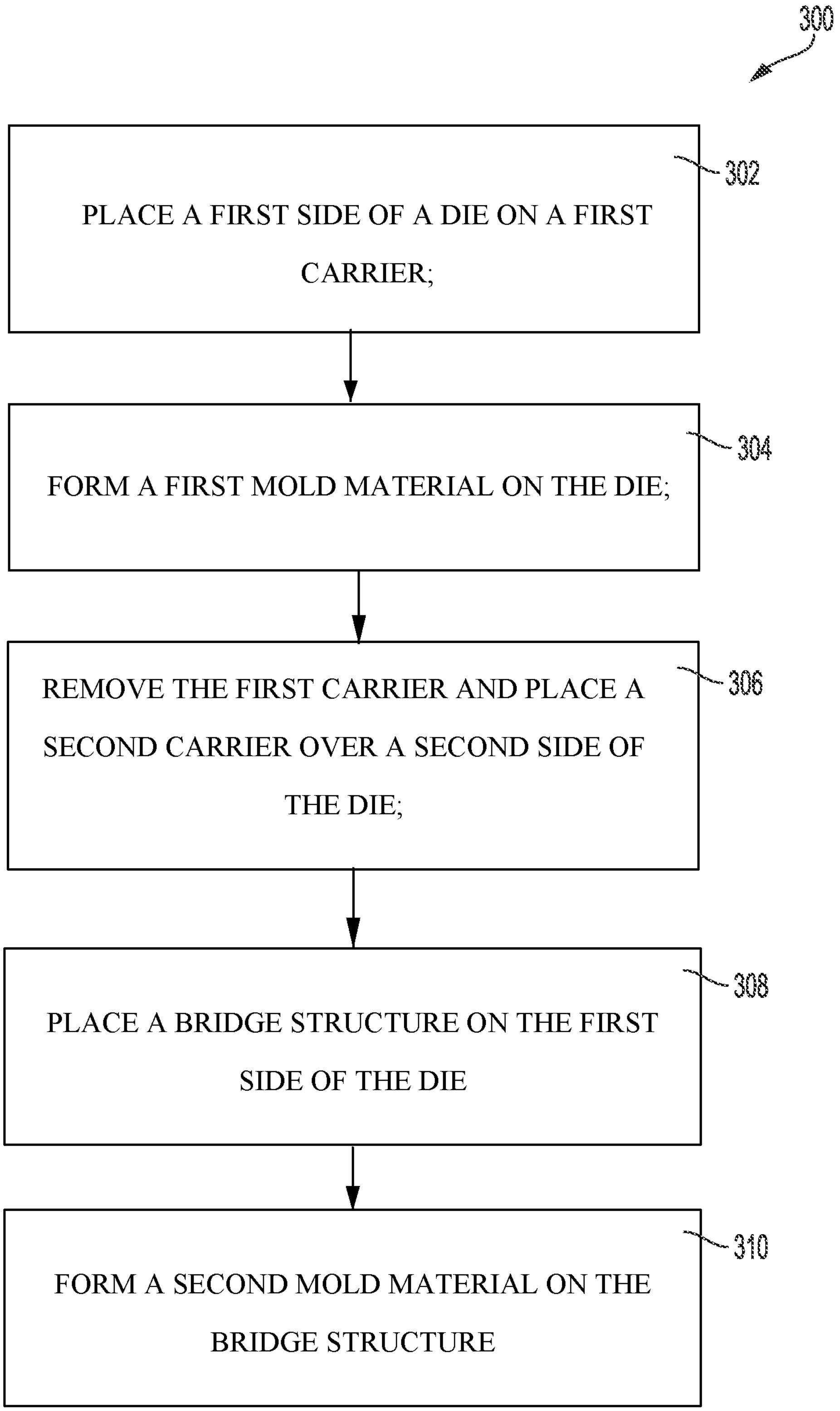
FIG. 3 illustrates a flow chart of a process for the fabrication of IC package structures having heterogeneous integration of various device thicknesses, in accordance with some embodiments.

FIG. 3 is a flow chart of a process 300 of fabricating a microelectronic IC package structure according to some embodiments. For example, process 300 may be used to fabricate any of the microelectronic IC package structures of FIGS. 2A-2I.

As set forth in block 302, a first side of a die is placed on a carrier. The first carrier may comprise any suitable material, such as a glass or a silicon material. The first carrier may comprise a temporary substrate with which to attach a device, such as an IC device, wherein the carrier may be subsequently removed from the die. The first carrier may comprise a surface with which to attach one or more die. In an embodiment, the first side of the die may be placed on the carrier surface and a second die may be placed adjacent to the first die on the carrier. In an embodiment, one or more dies may be placed on the carrier according to design requirements. In an embodiment, the first die comprises a first height, and the second die comprises a second height.

In an embodiment, the first height may be greater than the second height. In an embodiment, the first side of the first die and a first side of the second die may be attached to the carrier by utilizing a die attach process. The first side of the first die and the first side of the second die may be coupled to the surface of the first carrier with a plurality of conductive interconnect structures. In some embodiments, the conductive interconnect structures may comprise a copper material or a copper alloy. The die may comprise any suitable device such as a processer or a memory device.

As set forth in block 304, a first mold material is formed on the die. The first mold material may comprise an epoxy material and may comprise a height of between about 5 and 100 microns. The first mold material may be formed by utilizing any suitable mold formation process. The first mold material may comprise a plurality of thermally conductive filler particles in an embodiment. The thermally conductive filler particles may comprise a size of between about 20 nm and 100 microns, and a percent volume between about 3 and 97 percent volume. The thermally conductive particles may comprise aluminum silver, copper, or the like, in an embodiment. The first mold material may comprise a thermal conductivity of between about 0.5 and 500 W/m-K. The thermally conductive first mold material may comprise an epoxy material in an embodiment. The first mold material may be formed to surround the first die. In an embodiment, the first side of the first die may be substantially coplanar with a top surface of the first mold material. In an embodiment, a second die adjacent to the first die may be embedded within the first mold material.

As set forth in block 306, the first carrier may be removed from the first side of the first die and a second carrier is placed over a second side of the first die. The second carrier may comprise any suitable material, such as a glass or a silicon material. In an embodiment, the second carrier may be on the second side of the first die but not on an adjacent second die due to height difference between the first and a second die. There may be a distance between a second side of the second die and the surface of the first mold material.

As set forth in block 308, a bridge structure may be placed on the first side of the die. In an embodiment, the bridge structure may comprise an interposer or any other suitable with substrate with which to couple a first die to a second die, such as to an adjacent second die. In an embodiment, a first portion of the bridge structure is attached to a portion of the first die, and a second portion of the bridge structure is attached to a second die. In an embodiment, the bridge structure is attached to the first portion of the first die and on the entire second side of the second die with a die attach process. In an embodiment, the die attach process may comprise any suitable die attach process wherein a plurality of conductive interconnect structures, such as a plurality of solder balls for example, are utilized to attach the first portion of the first die and the entire second side of the second die to a first side of the bridge structure.

In another embodiment, the first and second dies may be attached to the bridge structure utilizing a thermal compression bond (TCB) process, as is known in the art. In an embodiment, the plurality of conductive interconnect structures, may comprise a plurality of single pitch conductive interconnect structures. In another embodiment, the first and second dies may be hybrid bonded to the bridge structure, utilizing a hybrid bonding process as is known in the art, wherein conductive features, on the bridge structure such as copper for example, may be hybrid bonded to conductive structures on the first and second dies.

In an embodiment, a via formation process may be utilized to form conductive vias on a second portion of the first die. The conductive vias are not formed on the first portion of the first die. Any suitable via formation process may be utilized to form the conductive vias, such as a plating process, for example. The conductive vias may comprise a height which is coplanar with a surface of the bridge structure in an embodiment.

Additionally, an underfill material may be formed using any suitable underfill formation process to surround the conductive solder interconnect structures on the second die and on the conductive solder interconnect structures on the first portion of the first die. In an embodiment, the underfill material may be formed/dispensed between the first side of the bridge structure and the second side of the first portion of the first die and the second side of the second die but may not be formed on the conductive via structures that are on the second portion of the first die. In an embodiment, the underfill material may comprise any suitable underfill materials such as nanofiller enabled epoxy underfill materials.

In an embodiment, a first dielectric material may be formed and patterned such that the first dielectric material is adjacent to the bridge structure and on the first mold material. In an embodiment, the first dielectric layer may comprise a silicon dioxide or a silicon nitride layer, for example, and may comprise a thickness of between about comprise a thickness of about 0.1 to 5 microns. In an embodiment, the first dielectric layer may be formed by utilizing a chemical vapor deposition (CVD) process, for example.

In an embodiment, pads and via structures may be formed on the second side of the bridge structure and on top surfaces of the conductive via structures. The conductive via and pad structures may comprise copper in an embodiment. Solder ball conductive structures may be formed on the conductive pads.

As set forth in block 310, a second mold material may be formed to surround the bridge structure and conductive via structures and is formed on the first dielectric material. In an embodiment, the second mold material is formed on portions of the underfill material. In an embodiment, a top surface of the second mold material is substantially coplanar with a surface of the bridge structure and top surfaces of the conductive via structures. In another embodiment, the first die and top surfaces of the conductive via structures are embedded within the top surface of the second mold material. In an embodiment, the second mold material may comprise a thickness of between about 25 and 800 microns.

In an embodiment, the second mold material may comprise a thermally conductive filler material and may comprise a thermal conductivity of between about 0.5 and 500 W/m-K, although any suitable thermal conductivity values may be utilized according to the particular application. In an embodiment, the second mold material may not comprise any thermally conductive filler materials and may comprise materials such that the second mold material may not be substantially thermally conductive. In an embodiment, the second mold material may comprise an epoxy material, or any other suitable mold material and may optionally include thermally conductive filler material such as aluminum, for example.

Additionally, a second dielectric material may be formed and patterned such that the second dielectric material is on a top surface of the second mold material and is adjacent to the conductive pads and vias associated with the bridge structure and the conductive vias. In an embodiment, the second dielectric layer may comprise a silicon dioxide or a silicon nitride layer, for example, and may comprise a thickness of between about 25 and 800 microns. In an embodiment, the second dielectric layer may be formed by utilizing a chemical vapor deposition (CVD) process, for example.

Figure 4:
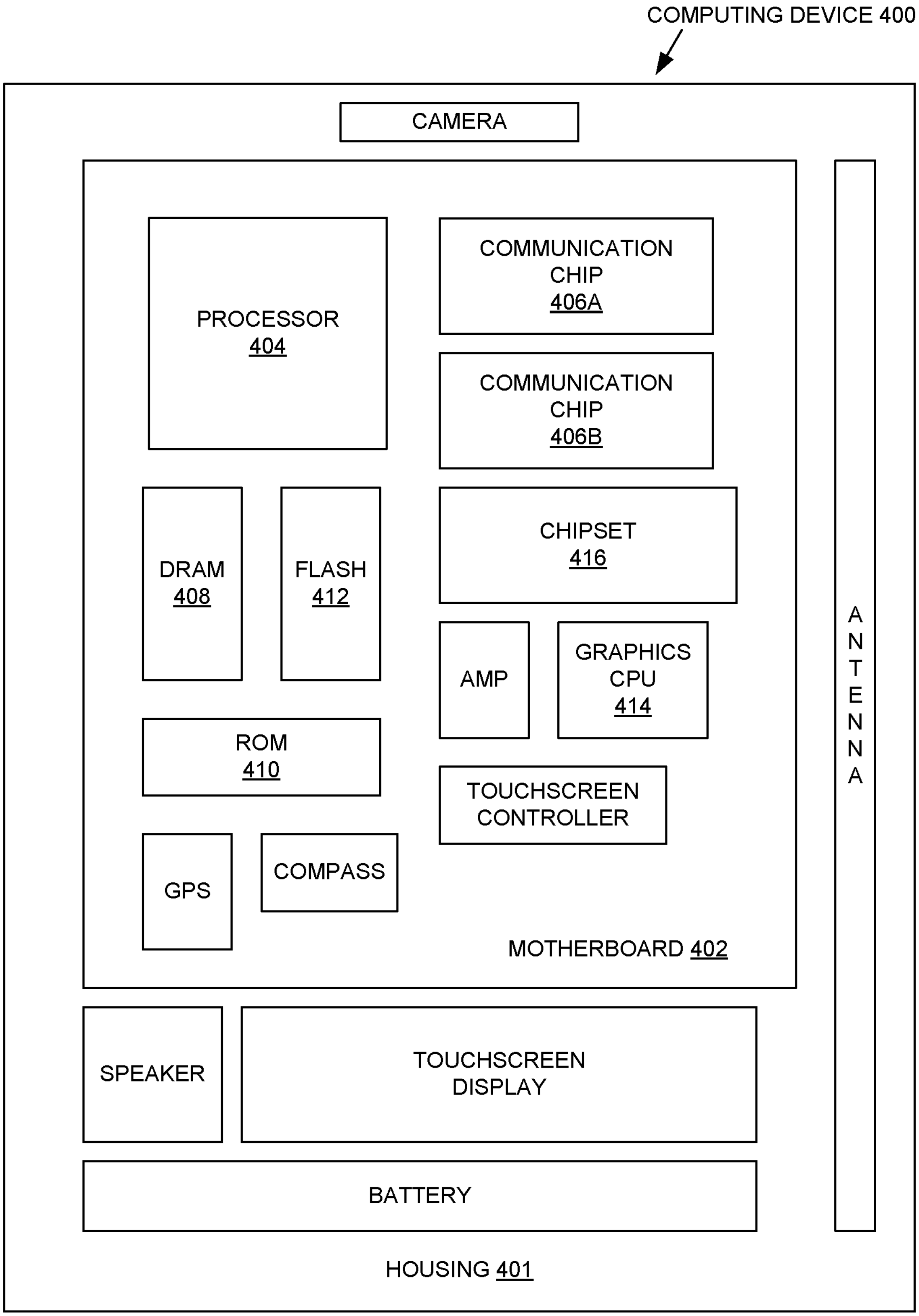
FIG. 4 is a functional block diagram of an electronic computing device, in accordance with some embodiments of the present disclosure.

FIG. 4 illustrates an electronic or computing device 400 in accordance with one or more implementations of the present description. The computing device 400 may include a housing 401 having a board 402 disposed therein. The computing device 400 may include a number of integrated circuit components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. At least one of the integrated circuit components may include a first die and a second die coupled to a bridge structure at an interface. A first thermally conductive mold material is on a first side of the interface and surrounds the first die and the second die. A second mold material is on a second, opposing side of the interface and surrounds the bridge structure.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. It is understood that the subject matter of the present description is not necessarily limited to specific applications illustrated in FIGS. 1-4. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein a first example is an integrated circuit package structure, comprising a first die and a second die, the first die and the second die coupled to a bridge structure at an interface. A first mold material is on a first side of the interface and surrounding the first die and the second die, and a second mold material on a second, opposing side of the interface and surrounding the bridge structure.

In second examples, the first example includes wherein a dielectric material is between the first mold material and the second mold material.

In third examples, for any of examples 1-2 wherein an underfill material is below the first mold material and adjacent the dielectric material.

In fourth examples, the third example includes wherein the underfill material is between the first die and the bridge structure.

In fifth examples, for any of examples 1-4 wherein a first portion of the first die is coupled to the bridge structure by one or more single pitch solder interconnect structures.

In sixth examples, the fifth example includes wherein a second portion of the first die is coupled to a substrate by one or more conductive via structures.

In seventh examples, for any of examples 1-6 wherein the first mold material comprises aluminum particles.

In eighth examples, for any of examples 1-7 wherein the first mold material comprises a thermally conductive filler.

In ninth examples, for any of examples 1-8 wherein a planar thermal interface material (TIM) is on the first mold material over the first and second die, and an integrated heat spreader (IHS) is on the TIM.

In tenth examples, for any of examples 1-9 wherein a height of the first die is different than a height of the second die.

In eleventh examples, for any of examples 1-9 wherein the bridge structure comprises one of a silicon material or a glass material.

A twelfth example is a microelectronic package structure, comprising a first die and a second die, the first die and the second die coupled to a bridge structure at an interface. A first mold material surrounding the first die and the second die, a second mold material surrounding the bridge structure, a thermal interface material (TIM) over the first mold material and an integrated heat spreader (IHS) on the TIM.

In thirteenth examples, the twelfth example includes wherein the TIM comprises a planar surface over the first mold material.

In fourteenth examples, for any of examples 12-13 wherein the IHS is coupled to a substrate.

In fifteenth examples, the fourteenth example includes wherein the IHS is coupled to a substrate.

In sixteenth examples, for any of examples 12-15 wherein the first mold material comprises a thermally conductive filler material.

A seventeenth example is a method comprising placing a first side of a die on a carrier, forming a first mold material over the die, removing the first carrier and placing a second carrier over a second side of the die, coupling a bridge structure to the first side of the die, and forming a second mold material on the bridge structure.

In eighteenth examples, the seventeenth example further comprising forming a planar thermal interface material (TIM) on the first mold material.

In nineteenth examples, for any of examples 17-18 wherein forming the first mold material comprises forming a thermally conductive material comprising a filler.

In twentieth examples, for any of examples 17-19 further comprising placing an integrated heat spreader on the TIM.

In twenty first examples, for any of examples 17-20 wherein placing the bridge structure on the first side of the die comprises placing a first portion of the bridge structure on a first portion of the die and forming conductive via structures on a second portion of the die.

In twenty second examples, for any of examples 17-21 further comprising placing a second die on the first carrier adjacent to the first die and coupling a second portion of the bridge structure to the second die.

In twenty third examples, for any of examples 17-22 further comprising forming a dielectric material between the first mold material and the second mold material.

It will be recognized that principles of the disclosure are not limited to the embodiments so described but can be practiced with modification and alteration without departing from the scope of the appended claims. The above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. A package structure, comprising:

a first die and a second die, the first die and the second die coupled to a bridge structure at an interface, wherein a height of the first die is different than a height of the second die;

a first mold material on a first side of the interface and surrounding the first die and the second die, wherein the first mold material comprises a planar surface over the first die and over the second die; and a second mold material on a second, opposing side of the interface and surrounding the bridge structure.

2. The package structure of claim 1, wherein a dielectric material is between the first mold material and the second mold material.

3. The package structure of claim 2, wherein an underfill material is below the first mold material and adjacent the dielectric material.

4. The package structure of claim 3, wherein the underfill material is between the first die and the bridge structure.

5. The package structure of claim 1, wherein a first portion of the first die is coupled to the bridge structure by one or more single pitch solder interconnect structures.

6. The package structure of claim 5, wherein a second portion of the first die is coupled to a substrate by one or more conductive via structures.

7. The package structure of claim 1, wherein the first mold material comprises aluminum particles.

8. The package structure of claim 1, wherein the first mold material comprises a thermally conductive filler.

9. The package structure of claim 1, wherein a planar thermal interface material (TIM) is on the first mold material over the first and second die, wherein the planar TIM is directly on the planar surface of the first mold material, and an integrated heat spreader (IHS) is on the planar TIM.

10. The package structure of claim 1, wherein the bridge structure comprises one of a silicon material or a glass material.

11. A package structure, comprising:

a first die and a second die, the first die and the second die coupled to a bridge structure at an interface, wherein a height of the first die is different than a height of the second die;

a first mold material surrounding the first die and the second die, wherein the first mold material comprises a planar surface over the first die and over the second die;

a second mold material surrounding the bridge structure;

a planar thermal interface material (TIM) directly on the planar surface of the first mold material; and an integrated heat spreader (IHS) on the planar TIM.

12. The package structure of claim 11, wherein the planar TIM comprises a planar surface over the planar surface of the first mold material.

13. The package structure of claim 11, wherein the IHS is coupled to a substrate.

14. The package structure of claim 13, wherein the first die comprises a first portion coupled to the bridge structure and a second portion coupled to the substrate.

15. The package structure of claim 11, wherein the first mold material comprises a thermally conductive filler material.

16. A method, comprising:

placing a first side of a first die on a carrier;

placing a first side of a second die on a carrier, wherein a height of the first die is different than a height of the second die;

forming a first mold material over the first die and over the second die, wherein the first mold material comprises a planar surface over the first die and over the second die;

removing the first carrier and placing a second carrier over a second side of the first die and over a second side of the second die;

coupling a bridge structure to the first side of the first die and to the first side of the second die; and forming a second mold material on the bridge structure.

17. The method of claim 16, further comprising forming a planar thermal interface material (TIM) on the planar surface of the first mold material.

18. The method of claim 16, wherein forming the first mold material comprises forming a thermally conductive material comprising a filler.

19. The method of claim 17, further comprising placing an integrated heat spreader on the planar TIM.

* * * * *